(12) United States Patent
Iadanza et al.

(10) Patent No.: US 7,868,809 B2
(45) Date of Patent: Jan. 11, 2011

(54) DIGITAL TO ANALOG CONVERTER HAVING FASTPATHS

(75) Inventors: Joseph A. Iadanza, Hinesburg, VT (US); Benjamin T Voegeli, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 12/389,618

(22) Filed: Feb. 20, 2009

(65) Prior Publication Data

US 2009/0160691 A1  Jun. 25, 2009

Related U.S. Application Data

(63) Continuation-in-part of application No. 11/962,276, filed on Dec. 21, 2007, now Pat. No. 7,710,302.

(51) Int. Cl.
*H03M 1/78* (2006.01)
(52) U.S. Cl. .................. 341/154; 341/144; 341/145
(58) Field of Classification Search .......... 341/144–154
See application file for complete search history.

(56) References Cited

U.S. PATENT DOCUMENTS

| | | | |
|---|---|---|---|
| 3,581,303 A | 5/1971 | Kelly | |
| 3,646,587 A | 2/1972 | Shaffstall et al. | |
| 3,877,021 A | 4/1975 | Raamot | |
| 4,415,881 A | 11/1983 | Lechner et al. | |
| 5,045,832 A | 9/1991 | Tam | |
| 5,059,978 A | 10/1991 | Valdenaire | |
| 5,495,245 A | 2/1996 | Ashe | |
| 5,568,147 A | 10/1996 | Matsuda et al. | |
| 5,604,501 A * | 2/1997 | McPartland | 341/144 |
| 5,648,780 A | 7/1997 | Neidorff | |
| 5,703,588 A | 12/1997 | Rivoir et al. | |
| 5,940,020 A | 8/1999 | Ho | |
| 5,969,658 A | 10/1999 | Naylor | |
| 5,977,897 A | 11/1999 | Barnes et al. | |
| 5,977,898 A | 11/1999 | Ling et al. | |
| 5,999,115 A * | 12/1999 | Connell et al. | 341/145 |
| 6,037,889 A | 3/2000 | Knee | |
| 6,054,884 A | 4/2000 | Lye | |
| 6,163,288 A | 12/2000 | Yoshizawa | |
| 6,166,672 A * | 12/2000 | Park | 341/145 |
| 6,169,510 B1 | 1/2001 | Bult et al. | |
| 6,181,265 B1 | 1/2001 | Lee | |
| 6,204,789 B1 | 3/2001 | Nagata | |
| 6,225,929 B1 | 5/2001 | Beck | |

(Continued)

OTHER PUBLICATIONS

Notice of Allowance, U.S. Appl. No. 12/139,318, Structures for Systems and Methods of Generating an Analog Signal, Dated: Jan. 2, 2009.

*Primary Examiner*—Linh V Nguyen
(74) *Attorney, Agent, or Firm*—Cantor Colburn LLP; David Cain

(57) ABSTRACT

A resistor-based digital to analog converter (DAC) having mux fastpaths, which selectively connect a subset (or an entirety) of voltage divider nodes in a DAC to either a higher level of multiplexor hierarchy, or a DAC output node, effectively bypassing one or more levels of multiplexor devices. In addition, the fastpaths may selectively connect lower levels of multiplexor hierarchy to higher levels of multiplexor hierarchy and/or a DAC output node.

16 Claims, 9 Drawing Sheets

U.S. PATENT DOCUMENTS

| | | | |
|---|---|---|---|
| 6,278,393 B1 * | 8/2001 | Lopata et al. | 341/144 |
| 6,388,599 B2 | 5/2002 | Yamamoto et al. | |
| 6,407,692 B1 | 6/2002 | Bult et al. | |
| 6,414,616 B1 * | 7/2002 | Dempsey | 341/144 |
| 6,433,717 B1 | 8/2002 | Leung | |
| 6,529,152 B1 * | 3/2003 | Piasecki et al. | 341/144 |
| 6,570,520 B2 * | 5/2003 | Ishii | 341/144 |
| 6,621,440 B2 | 9/2003 | Gorman | |
| 6,642,877 B2 | 11/2003 | Leung | |
| 6,650,267 B2 | 11/2003 | Bult et al. | |
| 6,724,336 B2 | 4/2004 | Leung et al. | |
| 6,782,499 B2 | 8/2004 | Osada et al. | |
| 6,885,328 B1 | 4/2005 | Kao et al. | |
| 6,914,547 B1 * | 7/2005 | Swaroop et al. | 341/144 |
| 6,914,574 B2 | 7/2005 | Fourdeux et al. | |
| 6,922,046 B2 * | 7/2005 | Liu et al. | 323/354 |
| 6,954,165 B2 | 10/2005 | Mallinson | |
| 6,958,720 B1 * | 10/2005 | Prater | 341/145 |
| 6,975,261 B1 | 12/2005 | Isham | |
| 6,995,701 B1 | 2/2006 | Churchill et al. | |
| 7,136,002 B2 * | 11/2006 | Dempsey et al. | 341/145 |
| 7,190,298 B2 | 3/2007 | Mulder | |
| 7,250,891 B2 | 7/2007 | Nishimura | |
| 7,304,596 B2 * | 12/2007 | Lin et al. | 341/145 |
| 7,397,407 B2 * | 7/2008 | Shimizu et al. | 341/148 |
| 7,414,561 B1 | 8/2008 | Brubaker | |
| 7,420,496 B2 | 9/2008 | Kim et al. | |
| 7,453,385 B2 | 11/2008 | Hino | |
| 7,532,142 B1 | 5/2009 | Voegeli et al. | |
| 2001/0038351 A1 * | 11/2001 | Brunolli et al. | 341/154 |
| 2002/0030620 A1 | 3/2002 | Cairns et al. | |
| 2002/0121995 A1 | 9/2002 | Tabler | |
| 2002/0186231 A1 | 12/2002 | Kudo et al. | |
| 2009/0160690 A1 | 6/2009 | Kawaguchi et al. | |
| 2009/0290632 A1 * | 11/2009 | Wegener | 375/240 |

\* cited by examiner

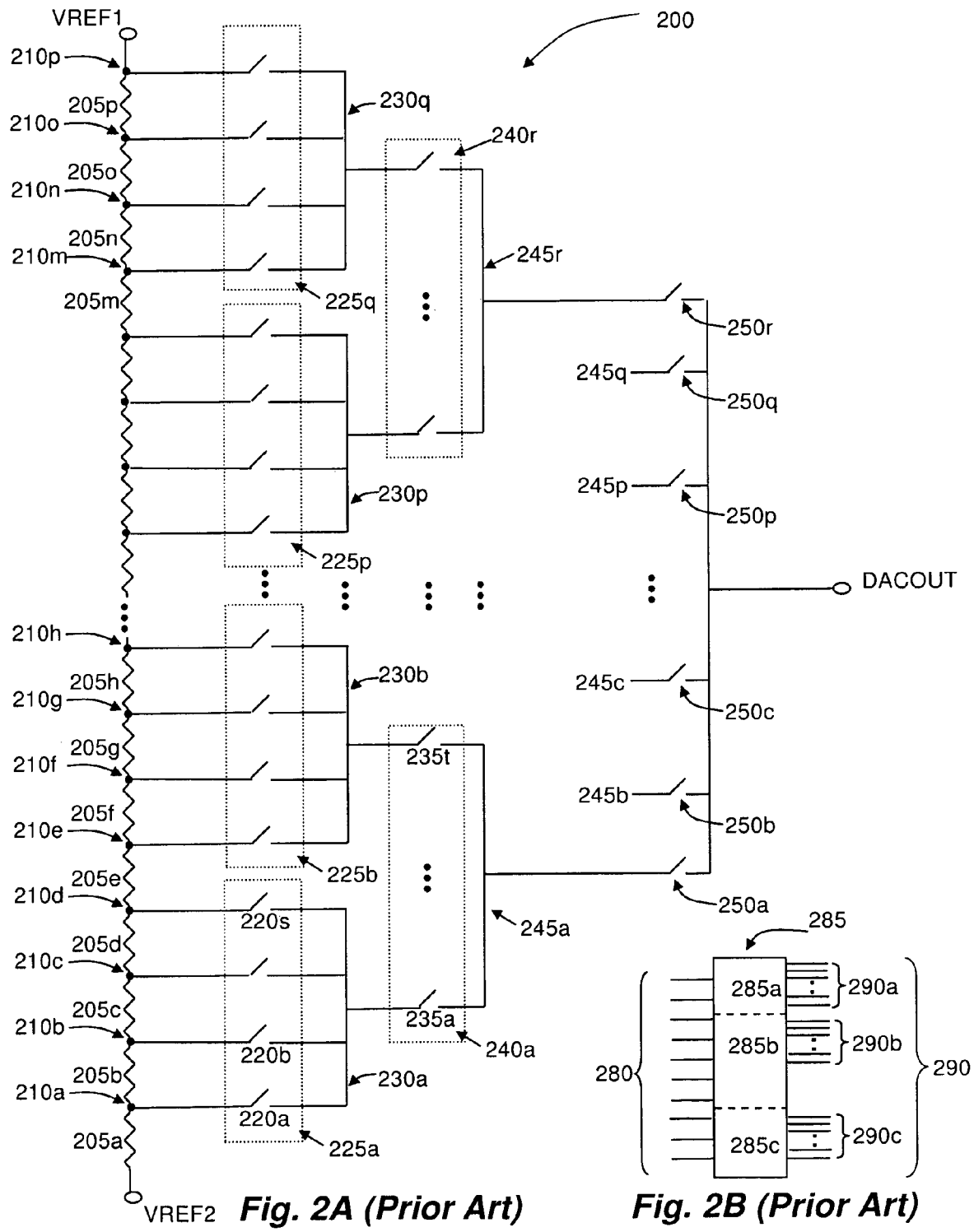
*Fig. 2A (Prior Art)*   *Fig. 2B (Prior Art)*

DIGITAL TO ANALOG CONVERTER HAVING FASTPATHS

CROSS REFERENCE TO RELATED APPLICATIONS

This Patent Application is a continuation in part of U.S. patent application Ser. No. 11/962,276 filed on Dec. 21, 2007 now U.S. Pat. No. 7,710,302; titled, "HIGH SPEED RESISTOR-BASED DIGITAL-TO-ANALOG CONVERTER (DAC) ARCHITECTURE"; assigned to the present assignee and is herein incorporated by reference.

FIELD OF THE INVENTION

This disclosure describes a digital to analog converter and more specifically a resistor-based digital to analog converter with multiplexor fastpaths.

BACKGROUND OF THE INVENTION

Resistor-based digital to analog converters (DACs) are constructed using a string of like size resistors between an upper and lower reference voltage and a set of muxing devices which selectively connect each node within the resistor network to the DAC output as shown in FIG. 1. The muxing devices 115 of DAC 100 may be a single transistor, a complimentary pair of transistors or other selective coupling device known in the art. DAC 100 includes resistors 105a-105p configured as resistor array series connected between VREF1 and VREF2. Selection gates 115a-115p connect voltage divider nodes 110a-110p to the DAC output, DACOUT. Address inputs 180 to DAC 100 are decoded by address decoder 185 to drive one of select signals 190 which enables one of selection gates 115a-115p to connect the chosen voltage divider node to DACOUT.

As the accuracy, or address bit width of DAC 100 increases, so must the number or resistors 105, voltage divider nodes 110 and selection gates 115 (e.g. multiplexers or muxs). DAC 100 has "P" resistors 105, voltage divider nodes 110 and selection gates 115 where $P=2^N$ and N is the number of address bits in DAC 100. For example, a 5 bit DAC 100 will have 32 voltage nodes 110 requiring muxing, an 8 bit DAC 100 will have 256 voltage nodes 110, and a 10 bit DAC 100 has 1024 voltage nodes 110. As the number of voltage nodes 110 increases, the load from the mux devices 115 limits the performance of DAC 100. Therefore, a DAC 100 having an N value larger than 5 is impractical for DAC 100.

To provide higher accuracy DACs and/or higher frequency operation, designers employ a mux hierarchy as shown in DAC hierarchy 200 of FIG. 2. DAC hierarchy 200 also has "P" resistors 205a-205p and "P" voltage divider nodes 210a-210p where "P" is defined 2N and N is the number of address inputs to DAC 200. In a hierarchical system $2^N$ selection gates or mux devices still provide selection of the resistor array via voltage divider nodes 210a-210p, however instead of all mux device outputs being connected to the DAC output, DACOUT, muxs are divided into first hierarchy multiplexor (mux) groups 225a-225q. DAC hierarchy 200 includes "Q" first hierarchy mux groups where "Q" is typically set to a power of 2 equal to or greater than $2^1$. Each first hierarchy mux group 225a-225q contains selection gates or mux devices 220a-220s select 1 of P/Q voltage divider nodes for connection to the output node of their respective first hierarchy output node 230a-230q where the number of first hierarchy mux groups and first hierarchy output nodes is equivalent. The "Q" first hierarchy output nodes output nodes are then multiplexed to the output, or alternatively to another level of hierarchy. Generally, DACs with address spaces of $2^8$ or larger use hierarchical muxing with 3 levels of muxing between the resistor array and the output being common. A DAC with 3 levels of output multiplexer hierarchy is illustrated in FIG. 2.

In illustrated DAC hierarchy 200, first hierarchy output nodes 230a-230q are selectively connected to $2^{nd}$ hierarchy output nodes 245a-245r through $2^{nd}$ hierarchy mux groups 240a-240r. Each $2^{nd}$ hierarchy mux group contains selection gates or mux devices 235a-235t and $2^{nd}$ hierarchy output nodes 245a-245r are selectively coupled to the output, DACOUT through $3^{rd}$ hierarchy mux devices 250a-250r. DAC 200 according to FIG. 2 has "R" $2^{nd}$ hierarchy mux groups, $2^{nd}$ hierarchy output nodes and $3^{rd}$ hierarchy mux devices where the value of R is typically set to a power of 2 equal to or greater than $2^1$. The number of selection gates or mux devices 235a-235t in each $2^{nd}$ hierarchy mux groups is set to "T" where T=Q/R. For example, in DAC 200 the value of N may be 10 yielding 1024 voltage divider nodes. Q and R values of 64 and 8 respectively would yield 64—first hierarchy mux groups 225a-225q each containing 16—first hierarchy selection gates or mux devices 220a-220s and connecting 16 voltage divider nodes to one of 64—first hierarchy output nodes 230a-230q, 8-$2^{nd}$ hierarchy mux groups 240a-240r each containing 8-$2^{nd}$ hierarchy selection gates or mux devices 235a-235t, connecting 8—first hierarchy output nodes to one of 8-$2^{nd}$ hierarchy output nodes 245a-245r, and 8-$3^{rd}$ hierarchy selection gates or mux devices, 250a-250r for selectively connecting one of the $2^{nd}$ hierarchy output nodes to DACOUT. The mux hierarchy allows a reduction in the capacitance which must be driven to change the DAC output to the voltage of any resistor divider node 210a-210p at the cost of extra mux delay/resistance due the multiple stages of selection gate or mux device which the data must flow through. For the example DAC with N=10, Q=64, R=8, any selected connection path between voltage divider nodes 210a-210p and the output is loaded by only 32 selection gates or mux devices as compared to 1024 mux devices for the DAC of FIG. 1, but the signal would have to propagate through three levels of mux device in series, increasing the resistive load.

Addresses 280 are decoded by address decoder 285 to enable connection of the chosen voltage divider node to DACOUT in DAC 200. Decoder 285 contains units 285a, 285b and 285c, each decoding a portion of address 280 to select the $1^{st}$ hierarchy selection gates, $2^{nd}$ hierarchy selection gates and $3^{rd}$ hierarchy selection gates required to complete the path between the voltage divider node and DACOUT. Select signals 290 are provided for connecting the address decoder to the $1^{st}$ hierarchy select gates (290a), the $2^{nd}$ hierarchy select gates (290b) and the $3^{rd}$ hierarchy select gates (Not Shown)

While hierarchical structures of DAC 200 work well for general purpose DACs in which the digital data pattern driving the DAC inputs is random, the delay imposed by the multiple stages of muxing limits the performance in DACs designed for use within successive approximation analog to digital converters (SARADCs). The reference ranging algorithm applied by the SAR demands the ability to switch across major portions of the address space during reset and the first several patterns of the approximation. What is needed is a resistor DAC node selection architecture which allows for both low output capacitance and low output resistance for performance-limiting addresses in order to maximize DAC performance.

BRIEF SUMMARY OF THE INVENTION

A DAC muxing structure having fastpaths is provided. While the majority of DAC voltage divider node selection is provided using a hierarchical mux structure, addresses which commonly limit the performance of the SARADC during reset and in early approximation steps are provided. Using a single selection gate or mux device fastpath from the resistor divider node to the output, DACOUT, limits the output resistance. A small number of nodes are connected to DACOUT through a single device or a small number of devices. As a result, large transients in output node voltages that result from transitioning across a significant portion of the address space in a single step can be accommodated by a low resistance path at the same time the output capacitance of the DAC is significantly reduced by the hierarchical mux design.

The resulting structure provides faster access for the addresses associated with the small number of voltage divider nodes while the adaptations to the known hierarchical multiplexing structure DAC 200 only nominally affect nodal capacitance.

BRIEF DESCRIPTION OF THE DRAWINGS

FIG. 2A illustrates another example of a DAC hierarchy known in the art;
FIG. 2B shows a known address decode circuit.

DETAILED DESCRIPTION

Figures 1A, 1B:
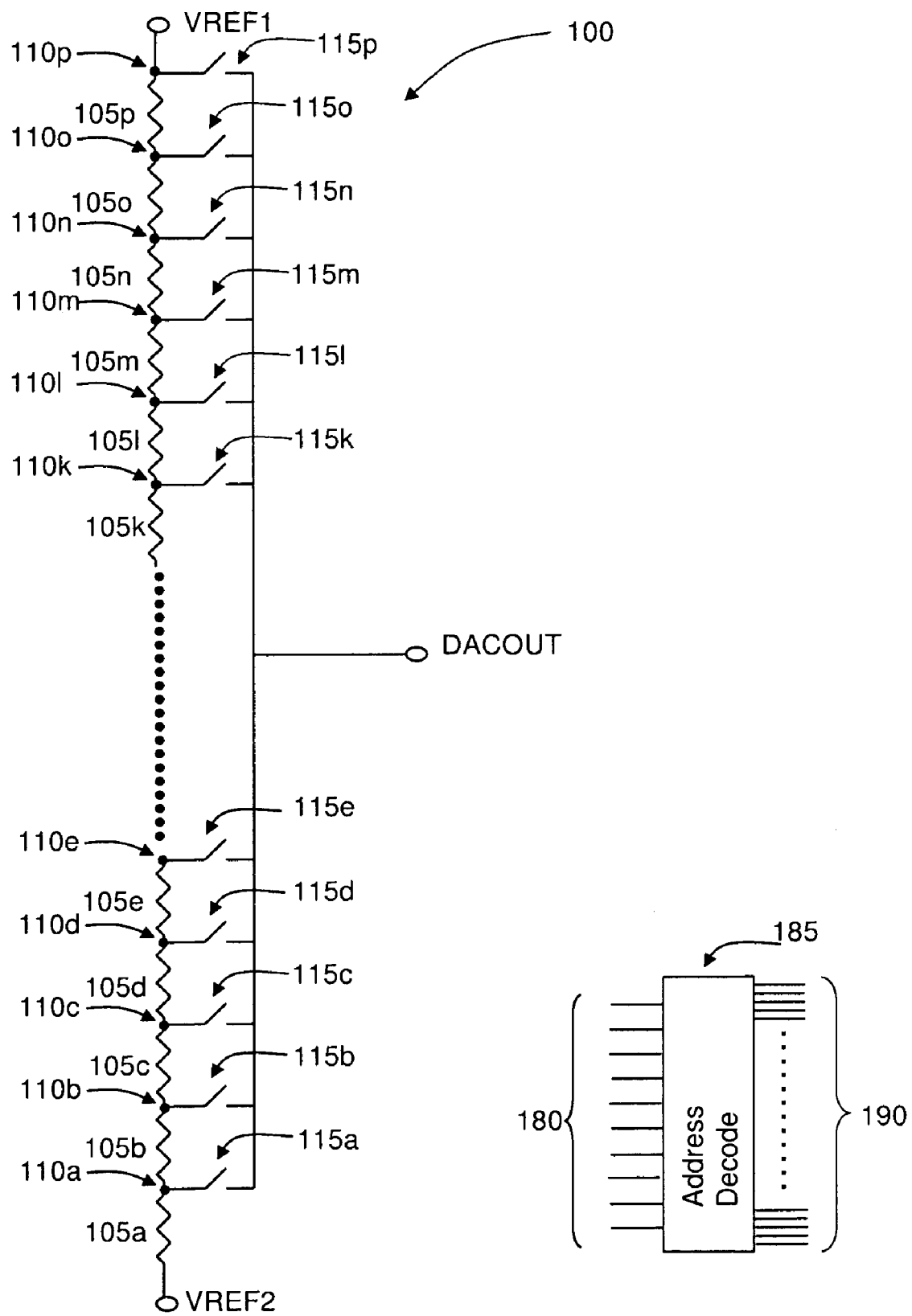
FIG. 1A illustrates an example of a DAC known in the art.
FIG. 1B shows a known address decode circuit.
Figures 3A, 3B:
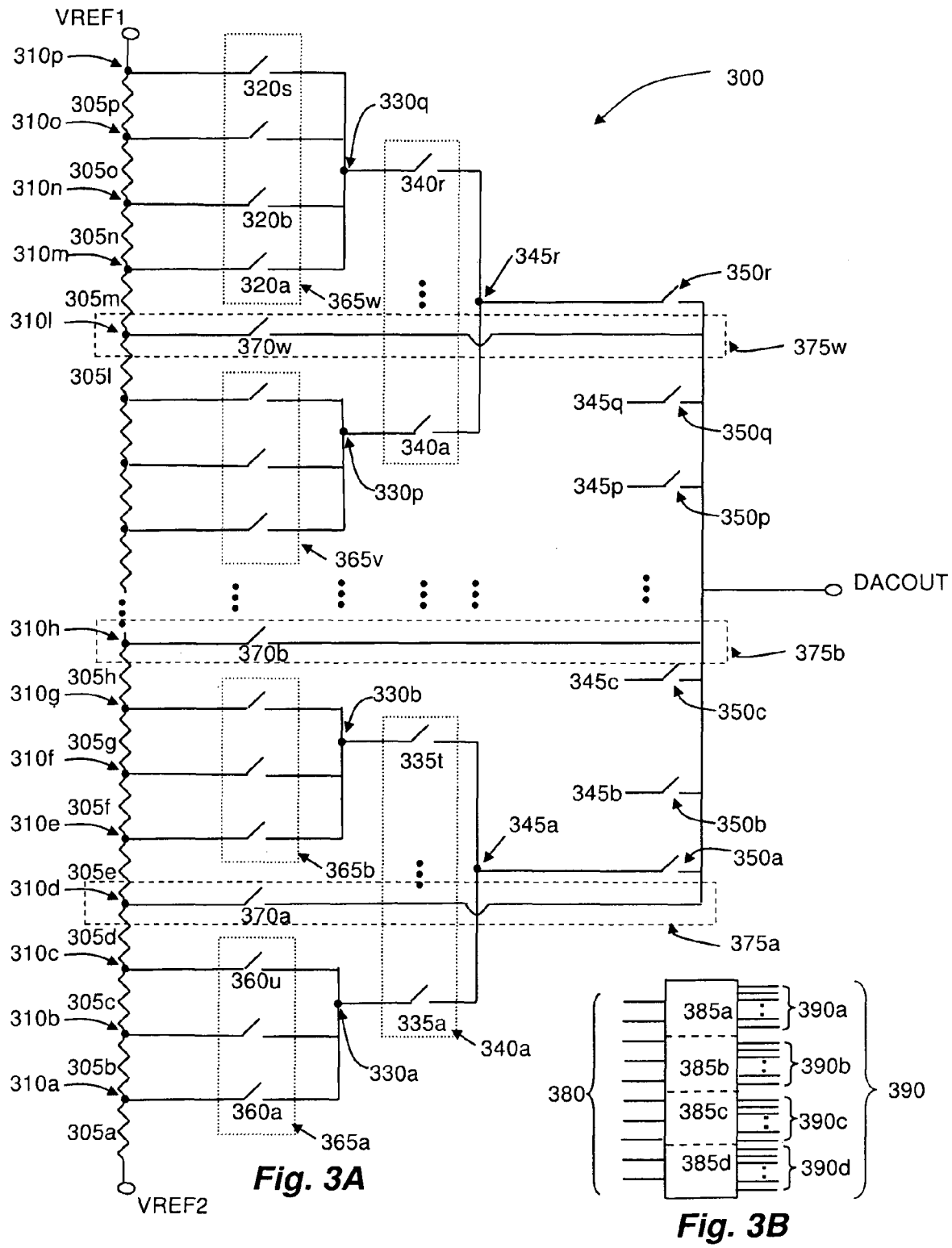
FIG. 3A illustrates a first embodiment of a DAC hierarchy.
FIG. 3B shows an example corresponding address decode architecture.

A first embodiment of the invention is illustrated in FIG. 3A as a DAC hierarchy 300. DAC hierarchy 300 is used for illustrative purposes only and should not be limited to what is shown in FIGS. 3A and 3B, DAC hierarchy 300 includes fastpaths 375, which further include one of selection gates 370, for select voltage divider nodes 310$d$, 310$h$, and 310$l$ respectively. Fastpaths 375$a$, 375$b$, and 375$w$ connect voltage divider nodes 310$d$, 310$h$, and 310$l$ respectively, to DACOUT. The voltage present on the majority of voltage divider nodes 310 must propagate through one or more levels of analog multiplexers: select gates 320, 360, 335, 340, and/or 350 (aka hierarchy mux groups) when addressed or accessed in order to reach DACOUT. However, in DAC hierarchy 300, fastpath 375$a$, associated with selection gate 370$a$, connects voltage divider node 310$d$ directly to DACOUT when selection gate 370$a$ is closed.

Select gates 320, 360, 335, 340, and/or 350 may comprise single transistors or a complimentary twisted transistor pair. In general, most voltage divider nodes 310$a$-310$p$ are connected to DACOUT through a series of selection gates 365 and 340. For example voltage node 310$a$ connects to DACOUT via 360$a$, 335$a$ and 350$a$ respectively, thereby limiting the capacitance on any voltage node 310.

Nodes selected for fastpath connections are determined with knowledge of the DAC addressing sequences. For instance, addresses associated with the first several approximation cycles in an ADCSAR are good candidates for fastpath connections.

The number of selection gates 360$a$-360$u$ in a first hierarchy mux group 365$a$, which connect voltage divider nodes 310$a$-310$c$ to first hierarchy output node 330$a$, is reduced from a value represented by P/Q to a value of P/Q-1 to account for the fastpath 375$a$ connection; where P is a any representative integer value for the number of voltage divider nodes 310, and Q is a representative integer value for the number of first hierarchies 330. For example, DAC hierarchy 200 of FIG. 2 connects four voltage divider nodes 210$a$-210$d$ through first hierarchy mux group 225$a$ to first hierarchy output node 230$a$. DAC hierarchy 300, however, has 3 voltage divider nodes 310$a$-310$c$ connected through first hierarchy mux group 365$a$ to first hierarchy output node 230$a$ while the fourth voltage divider node 310$d$ is connected via fastpath 375$a$. In a similar manner, fast paths 370$b$-370$w$ reduce the number of gates in their previously associated hierarchy mux groups 365$b$ and 365$v$ while respectively coupling voltage divider nodes 310$h$ and 310$l$ to DACOUT. First hierarchy mux groups 365$a$-365$v$ are designated as "reduced first hierarchy mux groups" because they comprise a fewer number of selection gates 360.

In DAC hierarchy 300, fastpaths 375 are implemented for each voltage divider node 310 in which improved DAC hierarchy 300 access is required and the fastpath 375 address uniquely defines respective voltage divider node 310. The number of fastpaths 375 provided in DAC hierarchy 300 is "V", where "V" may be any integer value desired which is less than $2^N$ but is generally in the range between 3 and 15. Within DAC hierarchy 300, not all first hierarchy mux groups 365 have the same number of selection gates 360 for connecting voltage divider nodes 310 to their respective first hierarchy output nodes 330. For example first hierarchy output node 330$q$ and associated first hierarchy mux group 365$w$ retains the P/Q mux device ratio of DAC hierarchy 200, and each of the P/Q voltage divider nodes 310 associated with first hierarchy mux group 365$w$ is coupled to DACOUT only through the hierarchical mux structures 345$r$ (i.e. no fastpath 375 exists for voltage divider nodes 310$m$-310$p$).

In another example, a first hierarchy output node 330 may be reduced in its connection to the resistor array by more than one mux device. As shown in DAC hierarchy 300, the fastpaths 375 couple voltage divider nodes 310 to the final level of address decoder hierarchy and/or DACOUT through a single analog select gate 370. One skilled in the art would recognize that the number of reduced first hierarchy mux groups 365$a$-365$v$ versus the number of first hierarchy mux groups 225 (FIG. 2) with a full compliment of selection gates 220 is arbitrary and is selected based on the number of voltage divider nodes 310 in DAC hierarchy 300 that require improved access.

To operate DAC hierarchy 300, the address decode 385 is adapted to recognize fastpath 375 addresses and enable only a single selection gate 370 connecting the addressed voltage divider node 310 to DACOUT. Address decode subunits 385a, 385b and 385c function to decode address 380 to generate and select $1^{st}$, $2^{nd}$ and $3^{rd}$ hierarchy selection signals 390a, 390b and 390c when a non-fastpath address is provided. Address decoder 385 further comprises subunit 385d for recognition of a fastpath address provided at address 380 and generation of fastpath selection signals 390d for operating fastpath selection gates 370. Recognition of the fastpath address may further prevent selection of any of gates 360 which connect additional voltage divider nodes 310 of the resistor array to each of the first hierarchy output nodes 330 as is a typical problem in DAC hierarchy 200. In DAC hierarchy 200 only a subset of the address bits control the decode of multiplexer select gates 220 for any single level of hierarchy 230. The fastpath decode of DAC hierarchy 300 therefore limits the amount of power consumed by DAC hierarchy 300 during a fastpath 375 access. The address decode further enables multiple series switches for non-fastpath voltage divider nodes using subsets of address bits to decode the multiplexer selection 360 at each level of hierarchy 330 and 345.

Figures 7A, 7B:
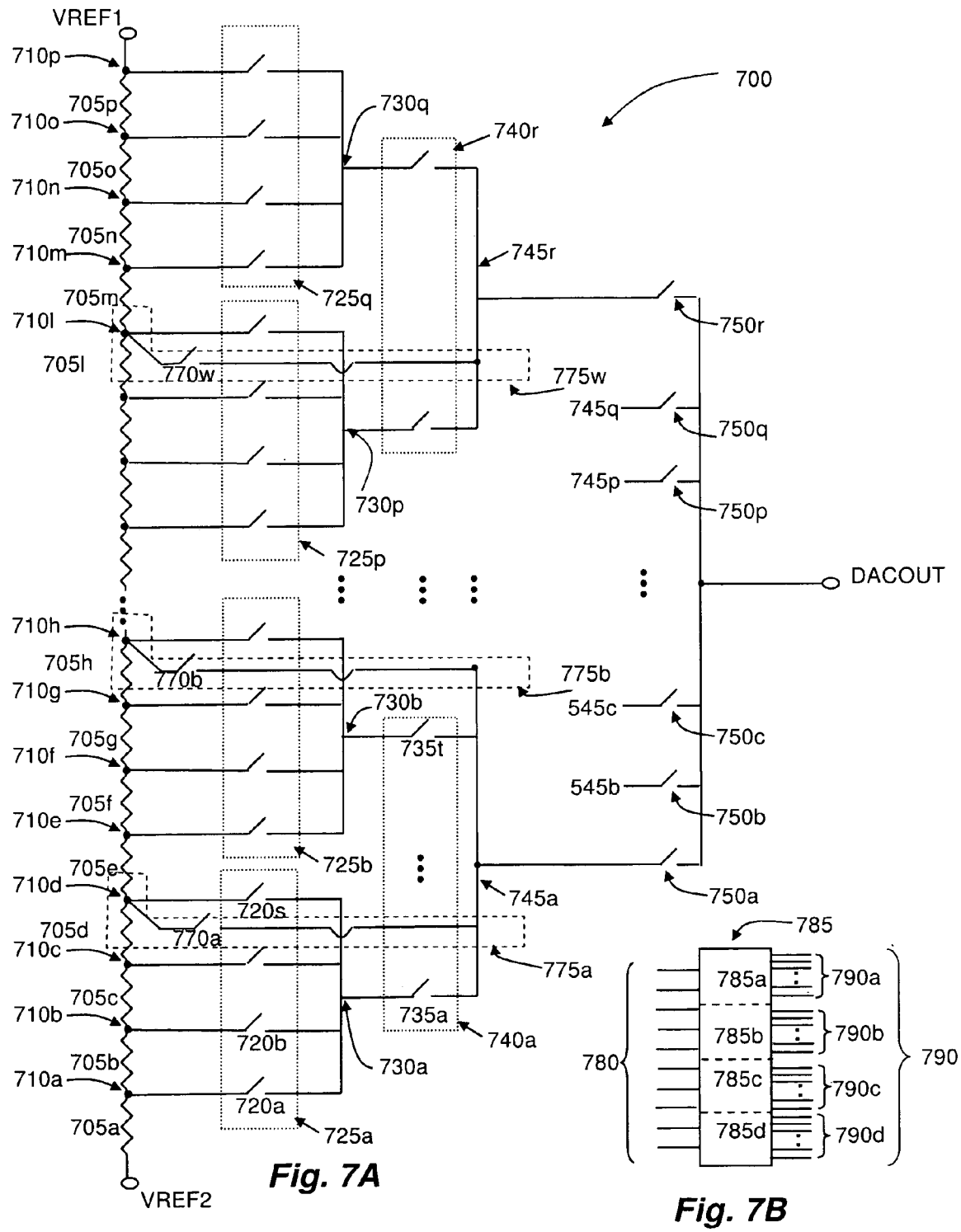
FIG. 7A shows a third embodiment of the DAC hierarchy; 7B shows a third example corresponding address decode architecture.

While DAC hierarchy 300 illustrates fastpaths 375, which connect voltage divider nodes 310 to DACOUT through only a single select gate 370, it is also conceivable that fastpaths can connect voltage divider nodes 310 to an intermediate level of hierarchy prior to DACOUT; for example, voltage divider node 310d connect to hierarchy level 345 instead of DACOUT (see FIG. 7A). Fastpaths can be used to provide preferred connectivity between alternate levels of hierarchy (i.e. not directly from a voltage node), for example between 330a and DACOUT (see FIG. 8A).

Figure 4:
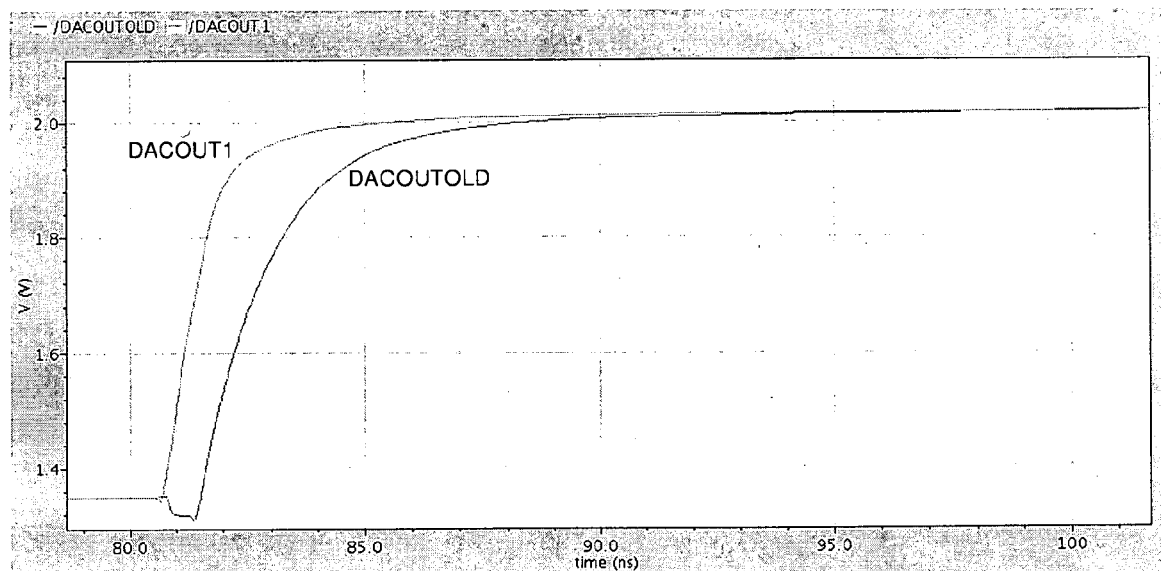
FIG. 4 shows a waveform output from Spectre® simulation software by Cadence™ Design Systems Inc. for the DAC of FIG. 3.

FIG. 4 shows a waveform output from a Spectre® simulation by Cadence™ Design Systems Inc. illustrating the workability of the embodiment. The simulation was performed using a CMOS10SF ADCSAR reference DAC with and without the fastpath. Blue waveform "DACOUTOLD" shows the output transition waveform for the hierarchical multiplexor architecture of FIG. 2 while pink waveform "DACOUT1" shows the same output transition for the disclosed multiplexor architecture, where the address is designated as a fastpath according to FIG. 3 and the description above. As can be seen, the fastpath enables faster transition of the output waveform under identical process, voltage, temperature, load, and input signal transition conditions.

Figures 5A, 5B:
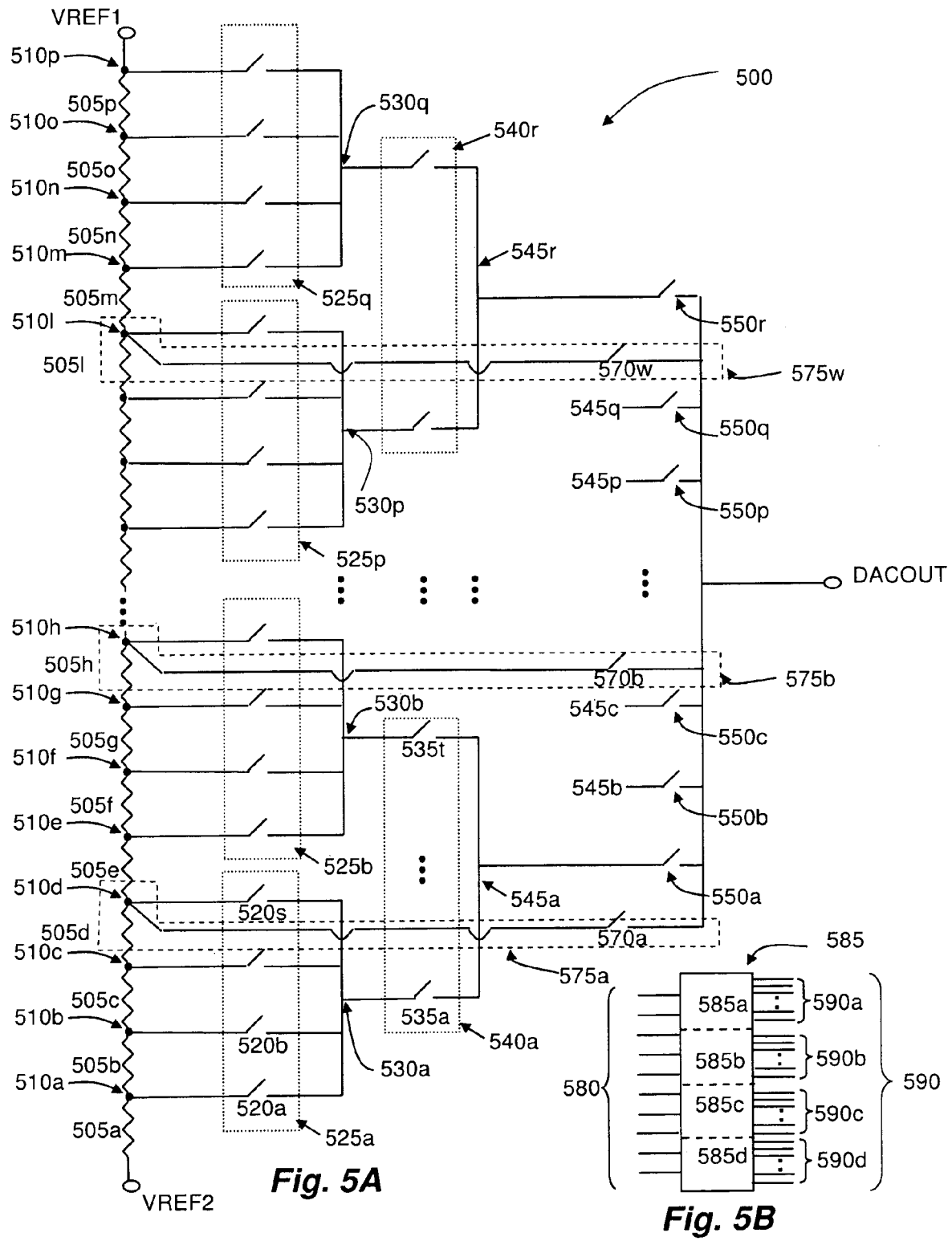
FIG. 5A shows another embodiment of the DAC hierarchy.
FIG. 5B shows another example corresponding address decode architecture.

An alternate embodiment, DAC hierarchy 500, is shown in FIG. 5A. In this embodiment, for selected nodes 510d, 510h and 510l, each of fastpaths 575a, 575b, and 575w are added in parallel with hierarchical path 530 and 545, rather than entirely replacing the hierarchical path (as described in FIG. 3). The address decode system 585, as shown in FIG. 5B, upon recognizing fastpath 575 addresses, enables both the fastpath multiplexor and the hierarchical multiplexers to provide two paths between the resistor string node and the output (DACOUT) or other higher hierarchy output node. Within DAC hierarchy 500, address decoder 585 decodes address 580. Units 585a, 585b and 585c within address decoder address 580 to generate select signals 390a, 390b and 390c to select $1^{st}$, $2^{nd}$ and $3^{rd}$ hierarchy selection gates to complete the connection between the voltage divider node and DACOUT in accordance with the DAC hierarchy of FIG. 2 while unit 585d recognizes and decodes fastpath addresses to generate fastpath select signals 590d to operate fastpath select gates 570 and form a parallel conduction path for fastpath addresses. For example, DAC hierarchy 500 has fastpath 575a which connects voltage divider node 510d to DACOUT in parallel with a series connection of selection gates 520s, 535a and 550a when voltage divider node 510d is addressed. In a similar manner fastpaths, 575b-575w provide parallel connections to DACOUT when selected. First hierarchy nodes 530a-530q each connect to a number represented by the ratio P/Q voltage divider nodes 510 to first hierarchy mux groups 525a-525q. Each comprise P/Q select gates 520 regardless of fastpaths 575 designed within DAC hierarchy 500.

Figure 6:
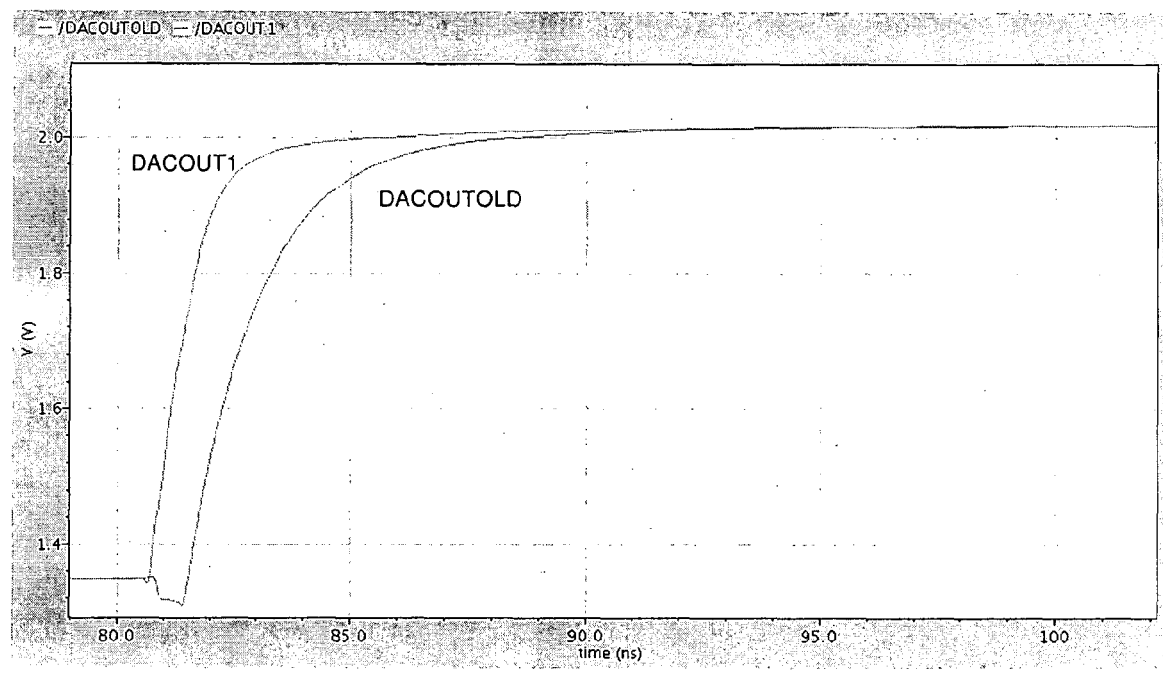
FIG. 6 shows a second output of a simulation using Spectre® simulation software by Cadence™ Design Systems Inc. for the DAC of FIG. 5.

FIG. 6 details the workability of DAC hierarchy 500 shown in FIGS. 5A and 5B. A prior art muxing structure in accordance with FIG. 2 is shown by the red "DACOUTOLD" waveform. The waveform provided by the parallel fastpath/ hierarchical structure of DAC hierarchy 500 is shown by the pink "DACOUT1" waveform. The fastpath architecture provides a significant performance benefit when simulated at identical process, voltage, temperature, load and input signal transition conditions.

FIG. 7A illustrates another alternative embodiment of the invention. Within DAC hierarchy 700, fastpaths 775 do not connect voltage divider nodes to the final level of hierarchy; DACOUT. Instead, fastpaths directly connect voltage divider nodes to intermediate levels of hierarchy, omitting one or more levels of hierarchy in DAC hierarchy 7000. For example, fastpath 775a couples voltage divider node 710d to $2^{nd}$ hierarchy output node 745a. Address decoder 785, shown in FIG. 7B operates in a manner similar to that of DAC hierarchy 500 of FIG. 5B to identify fastpath addresses provided at address inputs 780 and enable corresponding fastpath selection gates 770. Units 785a, 785b and 785c operate to control $1^{st}$, $2^{nd}$ and $3^{rd}$ hierarchy select gates (770) respectively to complete the connection between the chosen voltage divider node and DACOUT. While FIG. 7A illustrates a DAC hierarchy 700 where the fastpath 775 is in parallel with the hierarchical access paths 725 and 740, one skilled in the art would recognize that any portion or configuration of the hierarchical paths (725, 740, 750) may also be coupled as fastpaths 775.

Figures 8A, 8B:
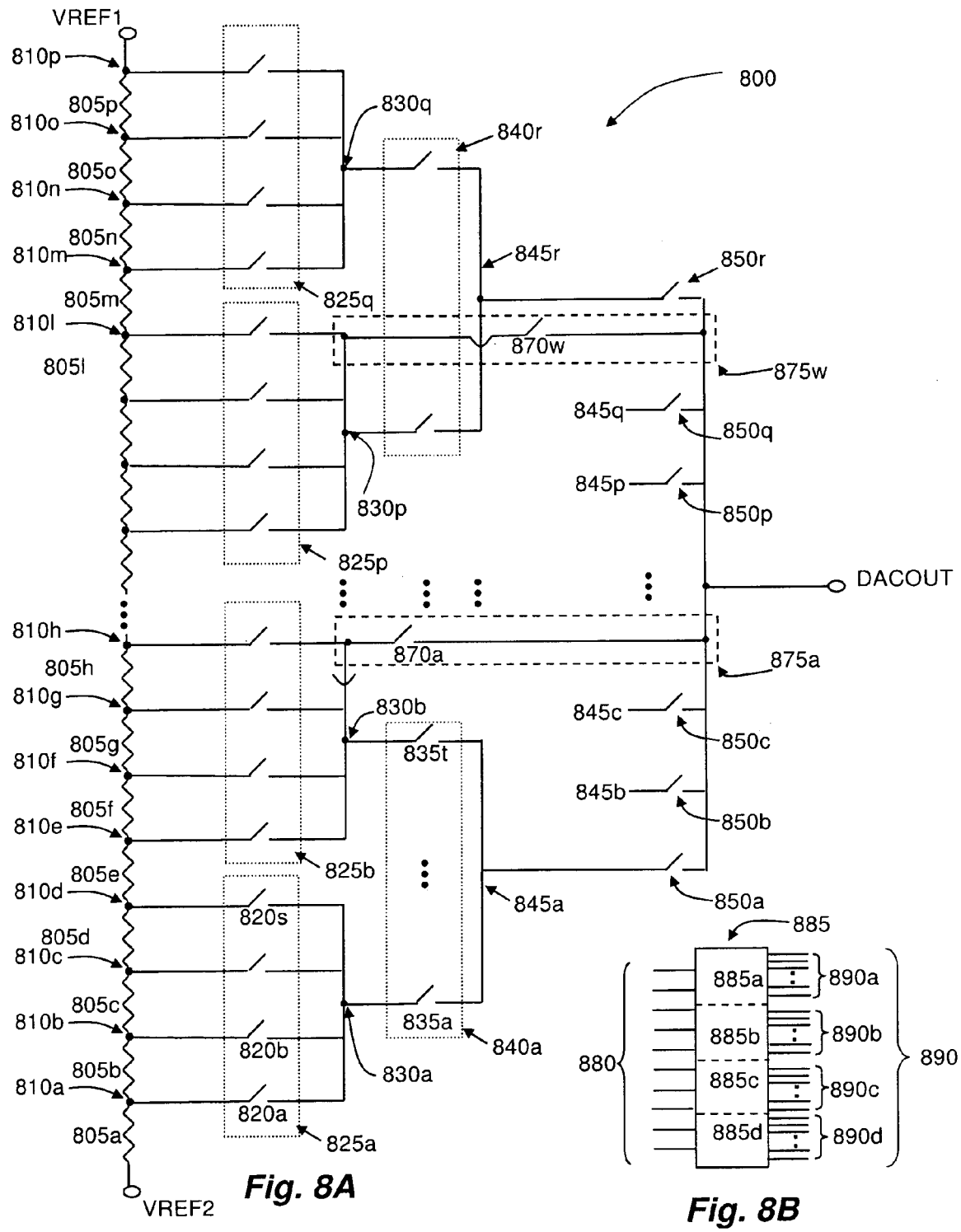
FIG. 8A shows a fourth embodiment of the DAC hierarchy; 8B shows a fourth example corresponding address decode architecture.

A fourth embodiment is shown in DAC hierarchy 800 of FIGS. 8A and 8B. Within DAC 800, fastpaths 875 provide a connection between two levels of hierarchy, neither of which is any voltage divider node 810, and bypass at least one level of hierarchy (825, 840, or 850). For example, fastpath 870a connects $1^{st}$ hierarchy output node 830b to DACOUT, bypassing $2^{nd}$ hierarchy output node 845a. Address decoder 885 operates to recognize fastpath 875 addresses and enable selection gates 825, 840, and/or 850 at each level of hierarchy accordingly. Although FIG. 8A illustrates fastpath 875 connections between a hierarchy node, e.g. 830 or 845 and DACOUT, in embodiments with greater than three levels of decode hierarchy, fastpaths 875 may connect to a node other than DACOUT. Further, while FIG. 8A illustrates fastpath 875 in parallel with the hierarchical access path 830b->835t->845a->850a, one skilled in the art would recognize that elimination of all or a portion of the hierarchical path similar to DAC hierarchy 300 is also possible.

Figure 9:
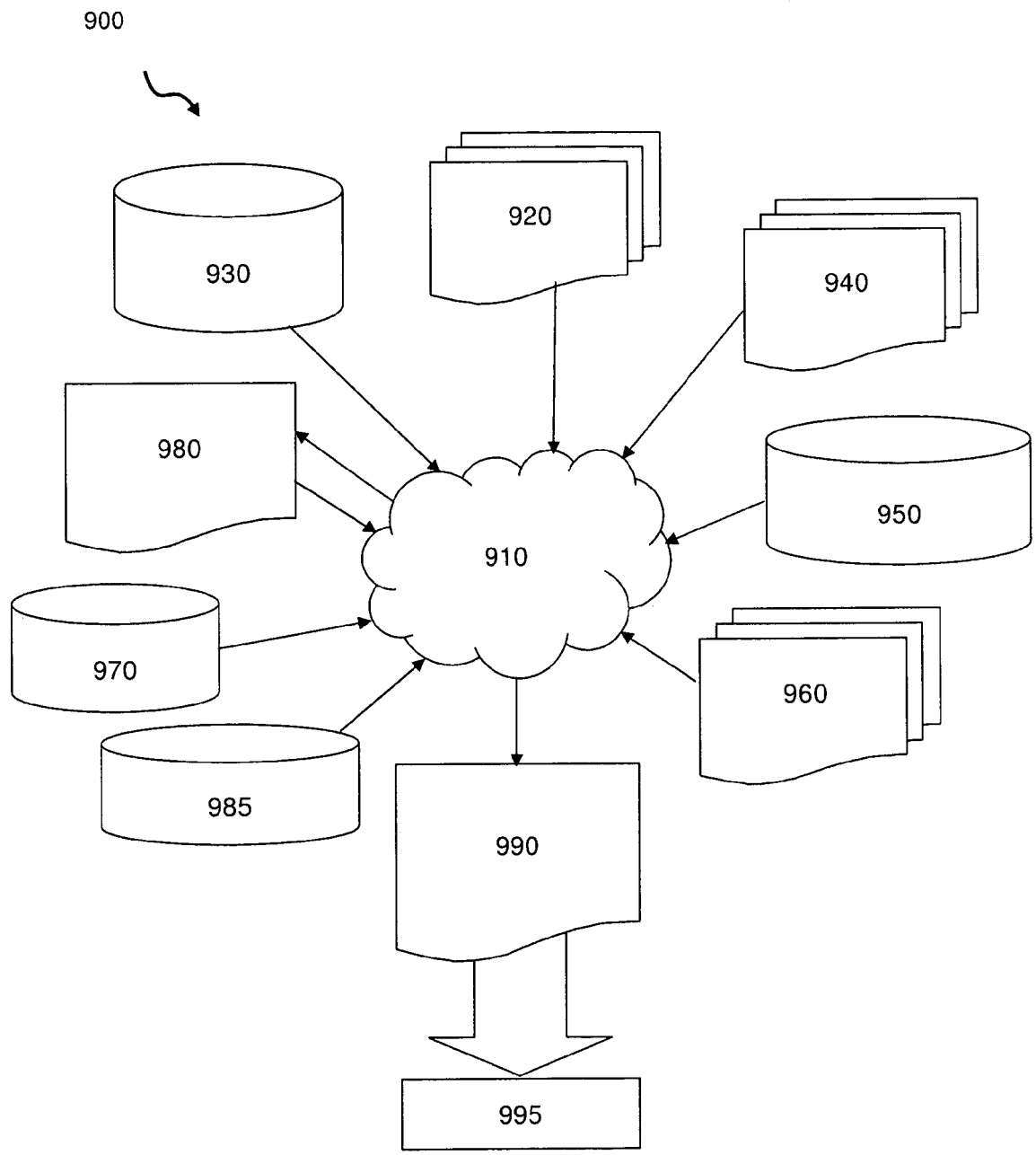
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown FIG. 3A, FIG. 5A, FIG. 7A and/or FIG. 8A. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 3A, FIG. 5A, FIG. 7A and/or FIG. 8A. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 3A, FIG. 5A, FIG. 7A and/or FIG. 8A to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3A, FIG. 5A, FIG. 7A and/or FIG. 8A. In one embodiment, design structure 990 may comprise a compiled, executable HDL simulation model that functionally simulates the devices shown in FIG. 3A, FIG. 5A, FIG. 7A and/or FIG. 8A.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/ developer to produce a device or structure as described above and shown in FIG. 3A, FIG. 5A, FIG. 7A and/or FIG. 8A. Design structure 990 may then proceed to a stage 995 where, for example, design structure 990: proceeds to tape-out, is released to manufacturing, is released to a mask house, is sent to another design house, is sent back to the customer, etc.

The above description and drawings are only to be considered illustrative of exemplary embodiments, which achieve the features and advantages of the invention. It should be appreciated by one of ordinary skill in the art that modification and substitutions to the DAC embodiments described herein can be made without departing from the spirit and scope of the invention. Accordingly, the invention is not to be considered as being limited by the foregoing description and drawings.

What is claimed is:

1. A digital to analog converter comprising:
   a first and second reference voltage (VREF1, VREF2);
   a voltage output (DACOUT);
   a plurality of resistors (305) coupled in series between the first and the second reference voltages;
   a plurality of voltage divider nodes (310) located between each one of the resistors;
   a first plurality of gates (365a, 340a, 350a) arranged hierarchically to generate a plurality of hierarchical structures (325, 345), are located between a first portion of the plurality of voltage divider nodes (310a-310c) and the voltage output; and
   at least one of a second plurality of gates (370a) coupling at least one of a second portion of the voltage divider nodes (310d) to the voltage output to generate a fastpath (375a), wherein at least one of the plurality of voltage divider nodes (510d) is coupled to the voltage output (DACOUT) by both the fastpath (575a) and a hierarchical path;
   wherein the hierarchical path comprises at least one of the plurality of hierarchical structures (525a and 540a).

2. The digital to analog converter of claim 1, wherein the fastpath is activated when a first address (390), generated by an address decoder (385) activates the at least one of the second plurality of gates (370a).

3. The digital to analog converter of claim 2 wherein the address decoder is further adapted to disable the first plurality of gates (365a, 340a, 350a) when the at least one of the second plurality of gates (370a) is selected.

4. The digital to analog converter of claim 1, further comprising a second address decoder (585) which generates a second address which further enables both the first plurality of hierarchical structures (525a and 540a) and the fastpath (575a).

5. The digital to analog converter of claim 1, wherein the fastpath (775) couples the at least one voltage divider node (710) to an intermediate hierarchy (745) of the hierarchical structures.

6. The plurality of gates of claim 1, wherein at least one of the plurality of gates comprises a transistor.

7. The plurality of gates of claim 1, wherein at least one of the plurality of gates comprises a complimentary transistor pair.

8. A method of accessing a voltage divider node within a digital to analog converter comprising:
   providing a first set of selective gates (370) for coupling a first set of voltage divider nodes (310d, h, l) to a voltage output (DACOUT);
   providing a second set of hierarchical gates (360) for coupling a second set of voltage divider nodes (310) to a third set of hierarchical gates (340);
   coupling the third set of hierarchical gates (350) to the voltage output using a fourth set of hierarchical gates (350);
   decoding a fastpath address associated with at least one of the first set of voltage divider nodes; and
   enabling a fastpath which comprises one of the first set of selective gates such that the at least one of the first set of voltage divider nodes is coupled to the voltage output when the fastpath address is decoded.

9. The method of claim 8, further comprising enabling a parallel path associated with the fastpath that connects the at least one of the first set of voltage divider nodes with its respective second, third, and fourth hierarchical gates when the fastpath address is decoded.

10. The method of claim 8, further comprising disabling a parallel path associated with the fastpath that connects the at least one of the first set of voltage divider nodes with its respective second, third, and fourth hierarchical gates when the fastpath address is decoded.

11. A digital to analog design structure tangibly embodied in a machine readable medium for manufacturing circuits comprising:
   a plurality of resistors (305) coupled in series between the first and the second reference voltages;
   a plurality of voltage divider nodes (310) located between each one of the resistors;
   a first plurality of gates (365a, 340a, 350a) arranged hierarchically to generate a plurality of hierarchical structures (325, 345), are located between a first portion of the plurality of voltage divider nodes (310a-310c) and the voltage output; and
   at least one of a second plurality of gates (370a) coupling at least one of a second portion of the voltage divider nodes (310d) to the voltage output to generate a fastpath (375a), wherein at least one of the plurality of voltage divider nodes (510d) is coupled to the voltage output (DACOUT) by both the fastpath (575a) and through a hierarchical path comprising at least one of the plurality of hierarchical structures (525a and 540a);
   wherein, the fastpath is in parallel with the hierarchical path.

12. The digital to analog design structure of claim 11, wherein the design structure comprises a netlist.

13. The digital to analog design structure of claim 11, wherein the design structure resides on storage medium as a data format used for the exchange of layout data of integrated circuits.

14. The digital to analog design structure of claim 11, wherein the design structure resides in a programmable gate array.

15. The digital to analog design structure of claim 11, wherein the fastpath (775) couples the at least one voltage divider node (710) to an intermediate hierarchy (745) of the hierarchical structures.

16. The digital to analog design structure of claim 11, wherein the fastpath is activated when a first address (380), generated by an address decoder (385) activates the at least one of the second plurality of gates (370a); and
   the address decoder is further adapted to disable the first plurality of gates (365a, 340a, 350a) when the at least one of the second plurality of gates (370a) is selected.

* * * * *